(12) United States Patent
Cho

(10) Patent No.: US 9,177,975 B2
(45) Date of Patent: Nov. 3, 2015

(54) ORGANIC LIGHT EMITTING DIODE DISPLAY HAVING A SPACER ON PIXEL ELECTRODE

(71) Applicant: SAMSUNG DISPLAY CO., LTD., Yongin, Gyeonggi-Do (KR)

(72) Inventor: Young Min Cho, Yongin (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 0 days.

(21) Appl. No.: 14/265,665

(22) Filed: Apr. 30, 2014

(65) Prior Publication Data

US 2014/0346478 A1   Nov. 27, 2014

(30) Foreign Application Priority Data

May 27, 2013  (KR) ................. 10-2013-0059798

(51) Int. Cl.
| | | |
|---|---|---|
| H01L 29/08 | (2006.01) | |
| H01L 35/24 | (2006.01) | |
| H01L 51/00 | (2006.01) | |
| H01L 29/04 | (2006.01) | |
| H01L 29/10 | (2006.01) | |
| H01L 31/00 | (2006.01) | |
| H01L 27/14 | (2006.01) | |
| H01J 1/62 | (2006.01) | |
| H01J 63/04 | (2006.01) | |
| H01L 27/12 | (2006.01) | |
| H01L 51/52 | (2006.01) | |
| H01L 27/32 | (2006.01) | |

(52) U.S. Cl.
CPC .......... *H01L 27/1255* (2013.01); *H01L 51/525* (2013.01); *H01L 27/3265* (2013.01)

(58) Field of Classification Search
None
See application file for complete search history.

(56) References Cited

U.S. PATENT DOCUMENTS

| | | | |
|---|---|---|---|
| 2005/0285509 A1* | 12/2005 | Funamoto et al. | 313/504 |
| 2010/0045173 A1* | 2/2010 | Kwon et al. | 313/504 |
| 2010/0072882 A1* | 3/2010 | Hwang et al. | 313/504 |
| 2013/0200422 A1* | 8/2013 | Chung et al. | 257/99 |

FOREIGN PATENT DOCUMENTS

| | | |
|---|---|---|
| JP | 2003-229258 A | 8/2003 |
| KR | 10-0742370 B1 | 7/2007 |
| KR | 10-0833773 B1 | 5/2008 |
| KR | 10-2008-0085553 A | 9/2008 |

\* cited by examiner

*Primary Examiner* — Michael Jung
(74) *Attorney, Agent, or Firm* — Lee & Morse, P.C.

(57) ABSTRACT

An organic light emitting diode display includes a first transistor on a substrate, a first electrode connected to the first transistor, and a pixel definition layer on the first electrode. The pixel definition layer has an opening exposing the first electrode. A spacer is formed at the opening. An organic emission layer is on the exposed first electrode, and a second electrode on the organic emission layer.

20 Claims, 10 Drawing Sheets

ORGANIC LIGHT EMITTING DIODE DISPLAY HAVING A SPACER ON PIXEL ELECTRODE

CROSS-REFERENCE TO RELATED APPLICATION

Korean Patent Application No. 10-2013-0059798, filed on May 27, 2013, and entitled, "Organic Light Emitting Diode Display," is incorporated by reference herein in its entirety.

BACKGROUND

1. Field

One or more embodiments described herein relate to a display device.

2. Description of the Related Art

An organic light emitting diode (OLED) display uses a plurality of pixels to generate images. Each pixel includes an organic light emitting layer between an anode and cathode. Electrons injected from the cathode and holes injected from the anode combine in the organic light emitting layer to form excitons. Light is emitted when the excitons transition from an excited state to a stable or ground state.

A variety of methods have been proposed for making an OLED display. One approach uses a laser to form color (e.g., red, green, and blue) light emitting layers for corresponding pixels. This approach is often referred to as laser-induced thermal imaging (LITI).

During the LITI method, a laser beam is irradiated through a mask pattern on a donor film. The donor film is formed of a base film and transfer layer. When irradiated, the mask pattern is transferred through the transfer layer to form a light emission layer. Through this method, each emission layer may be finely patterned. Also, the LITI method is a dry process which may prove to be beneficial in some applications.

However, the LITI method is not without drawbacks. For example, during fabrication, the donor film is disposed on and bonded to a substrate. During vacuum bonding, the donor film may move or shift in position. More specifically, when an organic material of the donor film is transferred to a protruded portion during bonding, the organic material may shift in position and/or may not remain on the donor film. When the donor film moves toward the light emitting region, the organic material may not be transferred to the light emitting region. As a result, a defective pixel may be formed.

SUMMARY

In accordance with one embodiment, an organic light emitting diode display includes a substrate; a first transistor on the substrate; a first electrode connected to the first transistor; a pixel definition layer on the first electrode and having an opening exposing the first electrode; a spacer at the opening; an organic emission layer on the exposed first electrode; and a second electrode on the organic emission layer. A storage capacitor may be on the substrate overlapping the opening. The spacer may overlap the storage capacitor.

The spacer may be within a boundary line of the storage capacitor. The may include a same material as the pixel definition layer. The organic emission layer may be formed by a transfer method.

The display may include an encapsulation substrate facing the substrate and encapsulating the organic emission layer. The display may include a scan signal line on the substrate; a data line insulated from and intersecting the scan signal line; and a second transistor connected to the scan signal line, the data line, and the first transistor. A source electrode of the first transistor may be connected to a driving voltage line, and a gate electrode of the first transistor may be connected to a drain electrode of a second thin film transistor.

A third transistor may be on the substrate, wherein a drain electrode of the first transistor is connected to a source electrode of the third transistor, and the first electrode is connected to the drain electrode. The third transistor may include a first gate insulating layer between a semiconductor and a gate electrode of the third transistor, and the first transistor may include a first gate insulating layer between a semiconductor and a gate electrode of the first transistor and a second gate insulating layer on the first gate insulating layer. The second gate insulating layer covers the gate electrode of the third transistor.

The display may include a storage capacitor having a first capacitor condenser plate on the first gate insulating layer and a second capacitor condenser plate on the second gate insulating layer and overlapping the first capacitor condenser plate. The first capacitor condenser plate may include a same material as the gate electrode of the third transistor, and the second capacitor condenser plate may include a same material as the gate electrode of the first transistor.

In accordance with another embodiment, a pixel includes a pixel definition layer having an opening; an organic light emitting device in the opening; and a spacer in the opening adjacent the organic light emitting device, wherein an upper surface of the spacer is above an upper surface of the organic light emitting device. The pixel may include a storage capacitor, wherein the opening overlaps the storage capacitor. The organic light emitting device may overlap the storage capacitor.

The organic light emitting device may include an organic emission layer between first and second electrodes. The pixel definition layer and spacer may have substantially a same thickness, and the upper surface of the spacer may be above an upper surface of the pixel definition layer. The spacer may be spaced from the pixel definition layer.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
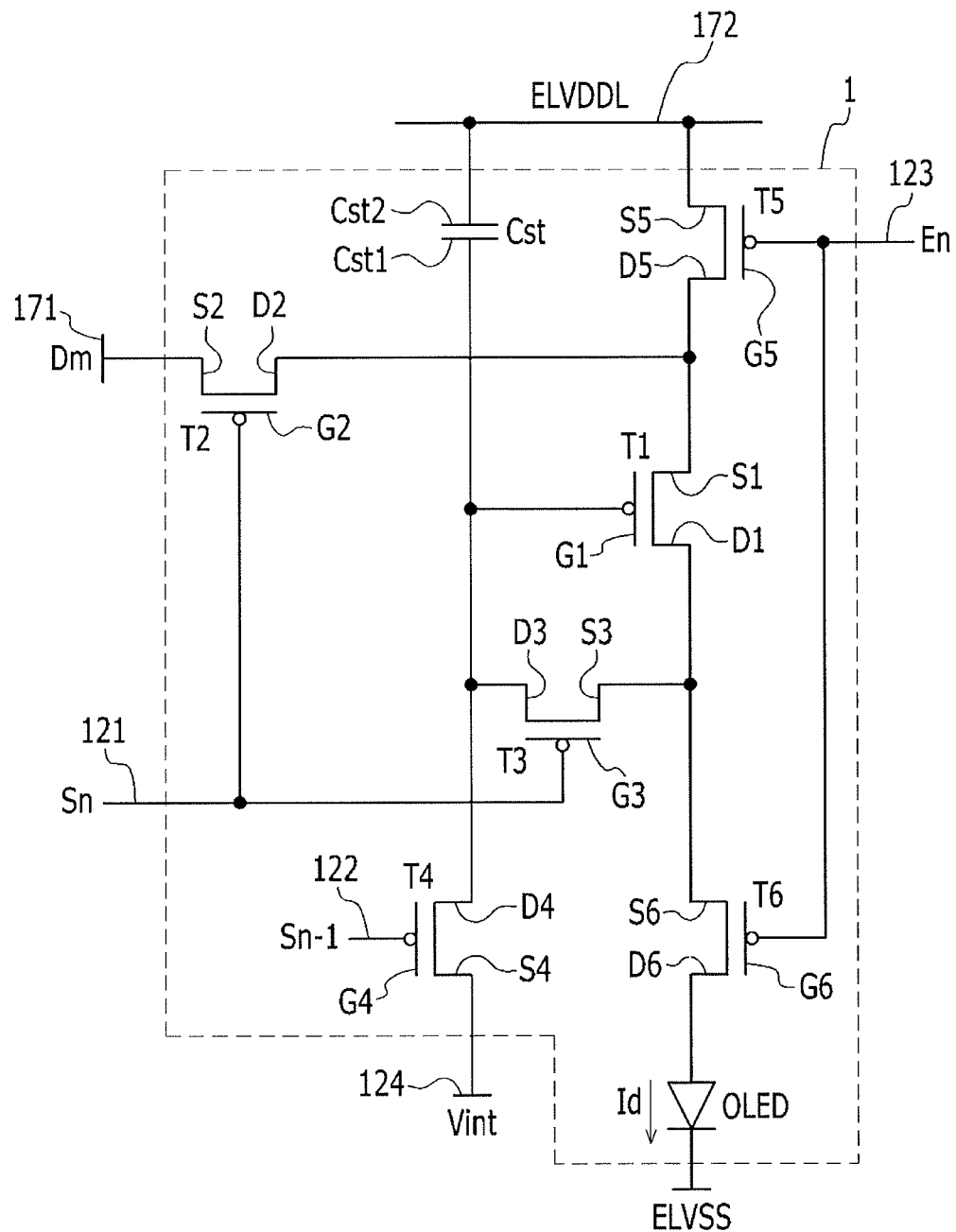
FIG. 1 illustrates an embodiment of a pixel of an OLED display.

Example embodiments are described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

FIG. 1 illustrates an embodiment of a pixel 1 included in an OLED display. The pixel 1 includes a plurality of thin film transistors connected to a plurality of signal lines, a storage capacitor Cst, and an organic light emitting diode 70. The transistors include a driving transistor T1, a switching transistor T2, a compensation transistor T3, an initialization transistor T4, an operation control transistor T5, and a light emission control transistor T6. All of these transistors may be, for example, thin film transistors.

The signal lines include a gate line 121 transmitting a scan signal Sn, a prior gate line 122 transmitting a prior scan signal Sn-1 to the fourth transistor T4, a light emission control line 123 transmitting a light emission control signal En to the fifth thin film transistor T5 and the sixth thin film transistor T6, a data line 171 intersecting the gate line 121 and transmitting a data signal DM, a driving voltage line 172 transmitting a driving voltage ELVDD and formed approximately parallel with the data line 171, and an initialization voltage line 124 transmitting an initialization voltage Vint initialing the first transistor T1.

A first gate electrode G1 of the first transistor T1 is connected to one end Cst1 of the storage capacitor Cst 80. A first source electrode S1 is connected to the driving voltage line 172 via the fifth transistor T5. A drain electrode D1 is connected to an anode of the OLED 70 via the sixth transistor T6. The first transistor T1 receives the data signal Dm according to a switching operation of the second transistor T2 and supplies a driving current ILD to the OLED 70.

A second gate electrode G2 of the second transistor T2 is connected to the gate line 121. A second source electrode S2 is connected to the data line 171. A second drain electrode D2 is connected to the first source electrode S1 of the first transistor T1 and connected to the driving voltage line 172 via the fifth transistor T5. The second transistor T2 is turned on according to the scan signal Sn received through the gate line 121, to thereby perform a switching operation for transmitting the data signal Dm from data line 171 to the first source electrode S1 of the first transistor T1.

A third gate electrode G3 of the third transistor T3 is connected to the gate line 121. A third source electrode S3 is connected to the first drain electrode D1 of the first transistor T1 and is connected to the anode of the OLED 70 via the sixth transistor T6. A third drain electrode D3 is connected to one end Cst1 of the storage capacitor 80, a four drain electrode D4 of the fourth transistor T4, and a first gate electrode G1 of the first transistor T1. The third transistor T3 is turned on according to the scan signal Sn received through the gate line 121, to diode-connect the first transistor T1 by connecting the gate electrode G1 and the drain electrode D1 of the first transistor T1.

A fourth gate electrode G4 of the fourth transistor T4 is connected to the prior gate line 122. A fourth source electrode S4 is connected to the initialization voltage line 124. The fourth drain electrode D4 is connected to the one end Cst1 of the storage capacitor Cst 80, the third drain electrode D3 of the third transistor T3, and the first gate electrode G1 of the first transistor T1. The fourth transistor T4 is turned on according to the prior scan signal Sn-1 received through the prior gate line 122, to transmit the initialization voltage Vint to the first gate electrode G1 of the first transistor T1. This latter function allows an initialization operation to be performed to initialize the voltage of the first gate electrode G1 of the first transistor T1.

A fifth gate electrode G5 of the fifth transistor T5 is connected to the light emission control line 12. A fifth source electrode S5 of the fifth transistor T5 is connected to the driving voltage line 172. A fifth drain electrode D5 of the fifth transistor T5 is connected to the first source electrode S1 of the first transistor T1 and the second drain electrode D2 of the second transistor T2.

A sixth gate electrode G6 of the sixth transistor T6 is connected to the light emission control line 123. A sixth source electrode S6 of the sixth transistor T6 is connected to the first drain electrode D1 of the first transistor T1 and the third source electrode S3 of the third transistor T3. A sixth drain electrode D6 of the sixth transistor T6 is electrically connected to the anode of OLED 70. The fifth transistor T5 and sixth transistor T6 are simultaneously turned on according to the light emission control signal En received through the light emission control line 123. As a result, the driving voltage ELVDD is transmitted to OLED 70 to allow driving current ILD to flow in OLED 70.

The other end Cst2 of the storage capacitor Cst 80 is connected to the driving voltage line 172. The cathode of OLED 70 is connected to a common voltage ELVSS. The OLED 70 emits light after receiving the driving current $I_{LD}$ from the first transistor T1 to display an image.

In a pixel circuit configured as described above, the first transistor T1 charges the storage capacitor Cst 80 with the voltage corresponding to the data signal Dm. The first transistor T1 provides current corresponding to the voltage charged in the storage capacitor 80 to the OLED 70, according to scan signal Sn. Because a threshold voltage of transistor T1 may change over time, the third transistor T3 connects the first transistor T1 in a diode structure according to the scan signal Sn, to thereby allow the threshold voltage Vth to be compensated.

Operation of a single pixel circuit of the OLED display will now be described. Initially, the prior scan signal Sn-1 of a low level is supplied through the prior gate line 122 during an initialization period. As a result, the fourth transistor T4 is turned on corresponding to the prior scan signal Sn-1 of the low level, the initialization voltage Vint is connected to the first gate electrode of the first transistor T1 through the fourth transistor T4 from the initialization voltage line 124, and the first transistor T1 is initialized by the initialization voltage Vint.

Thereafter, the scan signal Sn of the low level is supplied through the gate line 121 during a data programming period. Then, the second transistor T2 and the third transistor T3 are turned on corresponding to the scan signal Sn of the low level. At this time, the first transistor T1 is diode-connected by the third transistor T3 that is turned on and biased in a forward direction.

Then, the compensation voltage (Dm+Vth, where Vth is a negative value) is decreased as the threshold voltage Vth of the first transistor T1 in the data signal Dm supplied from the data line 171 is applied to the first gate electrode of the first transistor T1. The driving voltage ELVDD and the compensation voltage Dm+Vth are applied to respective ends of the storage capacitor Cst 80, and a charge corresponding to the voltage difference across the storage capacitor Cst 80 is stored in the storage capacitor Cst 80.

Then, light emission control signal En, supplied from the light emission control line 123 during a light emitting period, is changed from a high level to a low level. The fifth transistor T5 and sixth transistor T6 are turned on by the light emission control signal En of the low level during the light emitting period.

A driving current Id is generated based on a difference between the voltage of the first gate electrode G1 of the first transistor T1 and the driving voltage ELVDD. The driving current Id is supplied to the OLED 70 through the sixth transistor T6. A gate-source voltage Vgs of the first transistor T1 is maintained at "(Dm+Vth)−ELVDD" by the storage capacitor Cst 80 during the light emitting period. According to the current-voltage relationship for the first transistor T1, the driving current Id is proportional to the square of a value corresponding to the difference between the threshold voltage and the source-gate voltage, i.e., $(Dm-ELVDD)^2$. Accordingly, the driving current Id is determined regardless of the threshold voltage Vth of the driving transistor T1.

Figure 2:
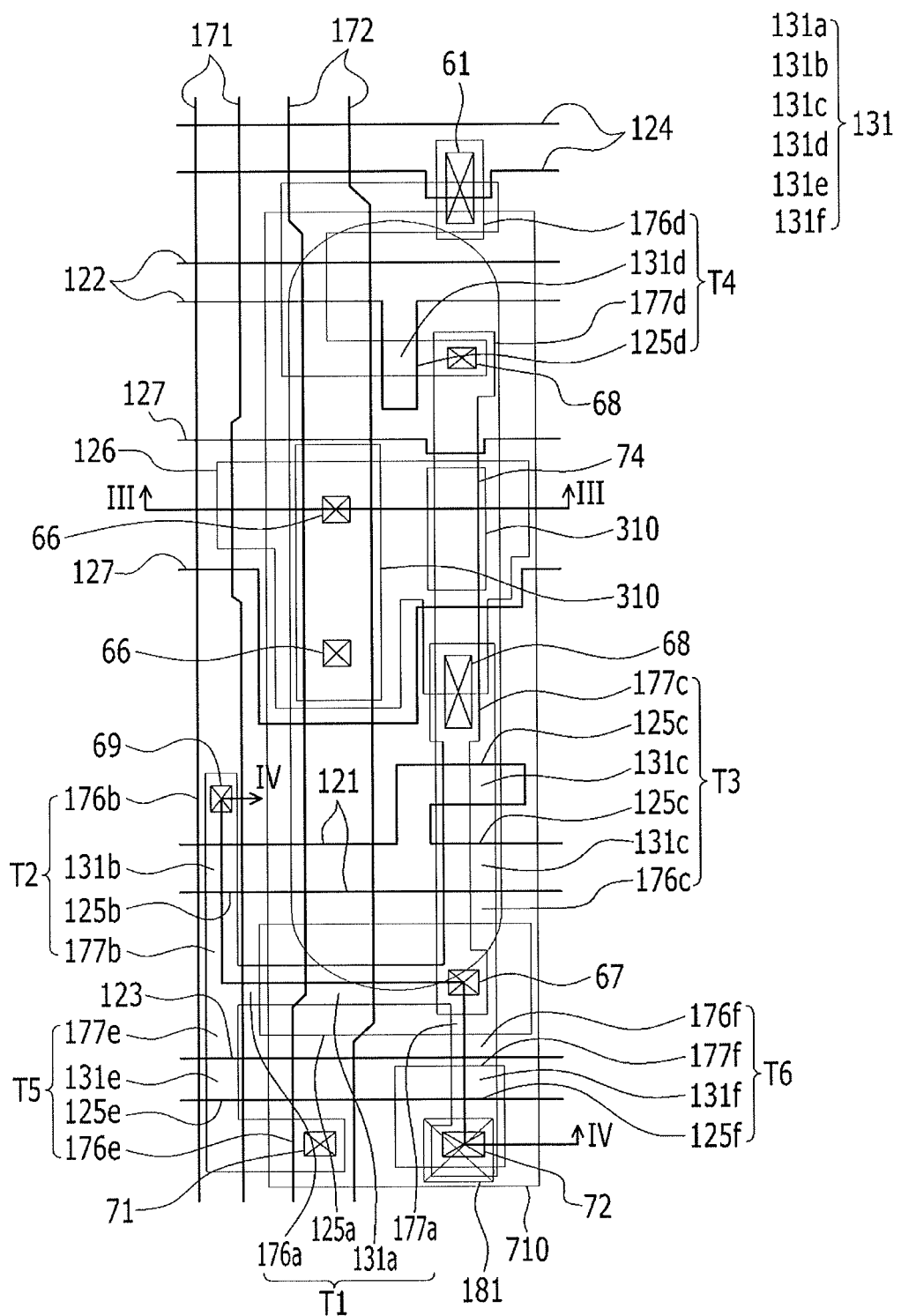
FIG. 2 illustrates an example of a layout view of this pixel.
Figure 3:
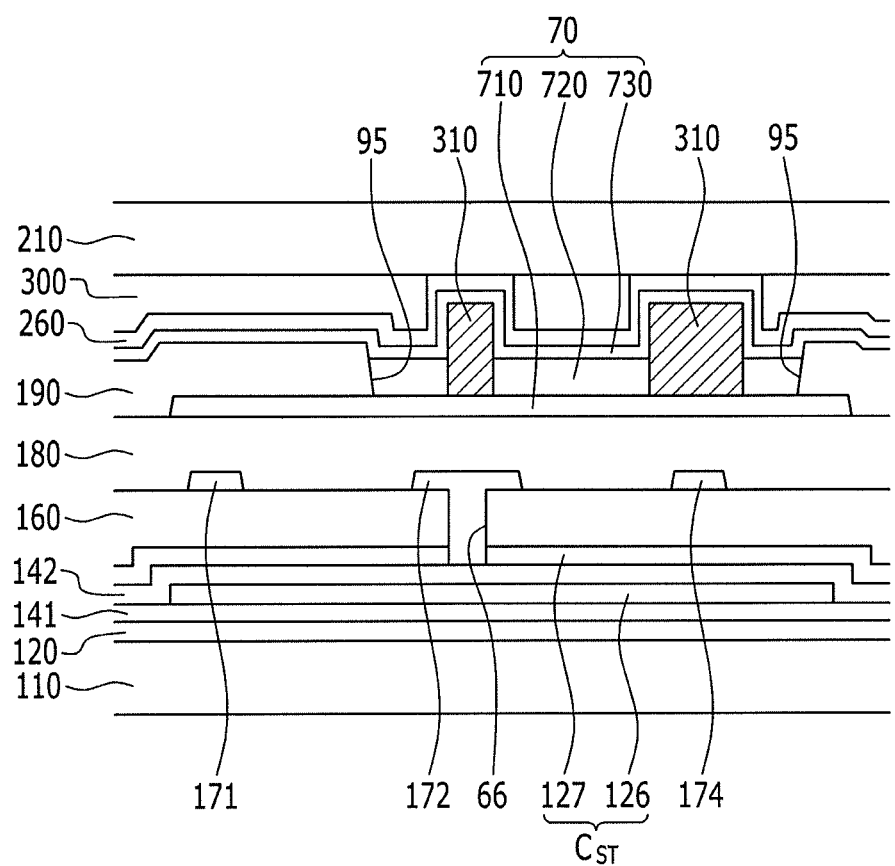
FIGS. 3 and 4 illustrate cross-sectional views respectively taken along line III-III and line IV-IV in FIG. 2.
Figure 4:
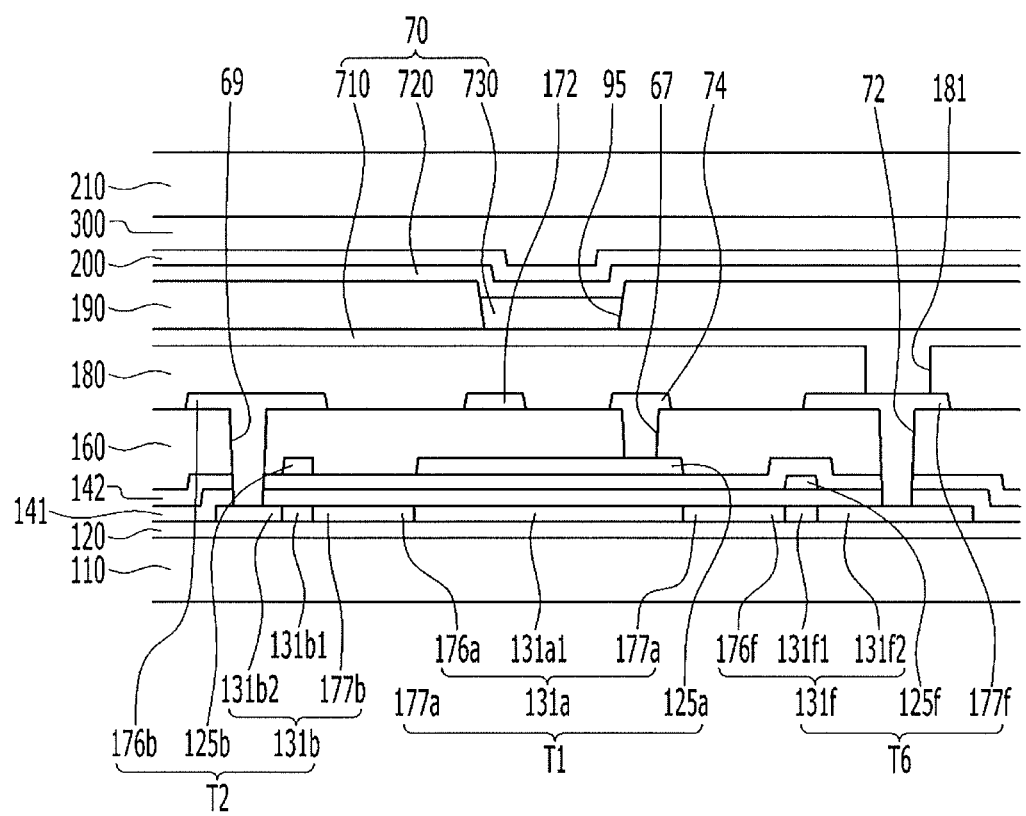

FIG. 2 illustrates an example of a layout of the pixel 1 in FIG. 1, and FIGS. 3 and 4 are cross-sectional views taken along line III-III and line IV-IV in FIG. 2. As shown in FIG. 2, the pixel 1 includes gate line 121, prior gate line 122, light emission control line 123, and initialization voltage line 124 which respectively apply a scan signal Sn, a prior scan signal Sn-1, a light emission control signal En, and an initialization voltage Vint. The aforementioned lines are formed in a row direction.

The OLED display also includes a data line 171 and a driving voltage line 172 intersecting the gate line 121, prior gate line 122, light emission control line 123, and initialization voltage line 124. The data line 171 and driving voltage line respectively apply a data signal Dm and a driving voltage ELVDD to the pixel.

As previously indicated, pixel 1 includes first transistor T1, second transistor T2, third transistor T3, fourth transistor T4, fifth transistor T5, sixth transistor T6, storage capacitor Cst, and OLED 70. These transistors are formed along a semiconductor 131, which may bend one or more times to realize various shapes.

The semiconductor 131 includes a first semiconductor 131*a* of the first transistor T1, a second semiconductor 131*b* of the second transistor T2, a third semiconductor 131*c* of the third transistor T3, a fourth semiconductor 131*d* of the fourth transistor T4, a fifth semiconductor 131*e* of the fifth transistor T5, and a sixth semiconductor 131*f* of the sixth transistor T6.

Semiconductor 131 may be made of polysilicon, microcrystalline silicon, or an oxide semiconductor. The oxide semiconductor may include any one oxide based on titanium (Ti), hafnium (Hf), zirconium (Zr), aluminum (Al), tantalum (Ta), germanium (Ge), zinc (Zn), gallium (Ga), tin (Sn), or indium (In), and may include zinc oxide (ZnO), indium-gallium-zinc oxide (InGaZnO4), indium-zinc oxide (Zn—In—O), zinc-tin oxide (Zn—Sn—O) indium-gallium oxide (In—Ga—O), indium-tin oxide (In—Sn—O), indium-zirconium oxide (In—Zr—O), indium-zirconium-zinc oxide (In—Zr—Zn—O), indium-zirconium-tin oxide (In—Zr—Sn—O), indium-zirconium-gallium oxide (In—Zr—Ga—O), indium-aluminum oxide (In—Al—O), indium-zinc-aluminum oxide (In—Zn—Al—O), indium-tin-aluminum oxide (In—Sn—Al—O), indium-aluminum-gallium oxide (In—Al—Ga—O), indium-tantalum oxide (In—Ta—O), indium-tantalum-zinc oxide (In—Ta—Zn—O), indium-tantalum-tin oxide (In—Ta—Sn—O), indium-tantalum-gallium oxide (In—Ta—Ga—O), indium-germanium oxide (In—Ge—O), indium-germanium-zinc oxide (In—Ge—Zn—O), indium-germanium-tin oxide (In—Ge—Sn—O), indium-germanium-gallium oxide (In—Ge—Ga—O), titanium-indium-zinc oxide (Ti—In—Zn—O), and/or hafnium-indium-zinc oxide (Hf—In—Zn—O) which are composite oxides thereof. When the semiconductor 131 is made of the oxide semiconductor, a separate protective layer may be added to prevent the oxide semiconductor from the external environment, such as high temperatures and the like.

Each transistor includes a source region and drain region formed at respective sides of a channel region. The source and drain regions may be doped with a conductivity impurity at a high concentration.

Each transistor may include a first gate electrode 125*a*, a second gate electrode 125*b*, a third gate electrode 125*c*, a fourth gate electrode 125*d*, a fifth gate electrode 125*e*, and a sixth gate electrode 125*f* overlapping the channel region of the semiconductors 131*a* to 131*e*. The first gate electrode 125*a* may be formed to include a same material, and may be formed on the same layer as the gate line 121, prior gate line 122, second gate electrode 125*b*, third gate electrode 125*c*, fourth gate electrode 125*d*, and a second capacitor condenser plate 127.

Each transistor may include a first source electrode 176*a*, a second source electrode 176*b*, a third source electrode 176*c*, a fourth source electrode 176*d*, a fifth source electrode 176*e*, and a sixth source electrode 176*f*. These electrodes are respectively connected to the source region of the semiconductors 131*a* to 131*e*. A first drain electrode 177*a*, a second drain electrode 177*b*, a third drain electrode 177*c*, a fourth drain electrode 177*d*, a fifth drain electrode 177*e*, and a sixth drain electrode 177*f* are respectively connected to the drain region of semiconductors 131*a* to 131*e*.

The first to sixth source electrodes and first to sixth drain electrodes may be made of different metals and may be formed on a different layer from the semiconductors. Each of the source region and drain region may be connected through a contact hole. In other embodiments, the source and drain regions may be made of a same metal.

The first transistor includes first semiconductor 131*a*, first gate electrode 125*a*, first source electrode 176*a*, and first drain electrode 177*a*. The first source electrode 176*a* corresponds to the source region, and the first drain electrode 177*a* corresponds to the first drain region in the first semiconductor 131*a*.

The second transistor T2 includes the second semiconductor 131*b*, second gate electrode 125*b*, second source electrode 176*b*, and second drain electrode 177*b*. The second source electrode 176*b* extends from data line 171, and the second drain electrode 177*b* corresponds to the drain region in the second semiconductor 131*b*.

The third transistor T3 includes the third semiconductor 131*c*, third gate electrode 125*c*, third source electrode 176*c*, and third drain electrode 177*c*. The third source electrode 176*c* corresponds to the source region in the third semiconductor 131*c*, and the third drain electrode 177*c* is connected to a connecting member 74.

The fourth transistor T4 includes the fourth semiconductor 131*d*, fourth gate electrode 125*d*, fourth source electrode 176*d*, and fourth drain electrode 177*d*. The fourth source electrode 176*d* is connected to the source region of the fourth semiconductor 131*d*. The fourth drain electrode 177*d* is connected to the drain region of the fourth semiconductor 131*d*.

The fourth source electrode 176*d* may be formed in a first gate insulating layer. A second gate insulating layer and an interlayer insulating layer may be simultaneously connected to the drain region of the initialization voltage line 124 and the fourth semiconductor 131d through a contact hole 61, which simultaneously exposes the initialization voltage line 124 and the fourth semiconductor 131d. The fourth drain electrode 177d is connected to the connecting member 74. The fourth drain electrode 177d is connected to the fourth semiconductor 131d through a contact hole 63 in the first gate insulating layer, second gate insulating layer, and interlayer insulating layer.

The fifth transistor T5 includes the fifth semiconductor 131e, fifth gate electrode 125e, fifth source electrode 176e, and fifth drain electrode 177e. The fifth source electrode 176e, which is a portion of the driving voltage line 172, is connected to the source region of the fifth semiconductor 131e through a contact hole 71 in the first gate insulating layer, the second gate insulating layer, and the interlayer insulating layer. The fifth drain electrode 177e corresponds to the drain region in fifth semiconductor 131e.

The sixth transistor T6 includes the sixth semiconductor 131f, sixth gate electrode 125f, sixth source electrode 176f, and sixth drain electrode 177f. The sixth source electrode 176f corresponds to the source region in the sixth semiconductor 131f. The sixth drain electrode 177f is connected to the drain region of sixth semiconductor 131f through a contact hole 72 in the first gate insulating layer, the second gate insulating layer, and the interlayer insulating layer.

One end of first semiconductor 131a is connected to the second semiconductor 131b and fifth semiconductor 131e, and shares the source region or drain region which is a high concentration doped region. The other end of the first semiconductor 131a is connected to third semiconductor 131c and sixth semiconductor 131f, and shares the source region or drain region which is a high concentration doped region.

Therefore, the first source electrode 176a is connected to the second drain electrode 177b and fifth drain electrode 177e. The first drain electrode 177a is connected to the third source electrode 176c and sixth source electrode 176f.

The storage capacitor 80 includes a first capacitor condenser plate 126 and a second capacitor condenser plate 127 disposed to have at least one of the first gate insulating layer or the second gate insulating layer therebetween. The first gate insulating layer and second gate insulating layer may include a dielectric material. The capacitance of storage capacitor 80 is determined by the voltage between condenser plates 126 and 127 and a charge accumulated in the storage capacitor 80.

The first capacitor condenser plate 126 may include a same material, and may be formed on the same layer as the light emission control line 123, initialization voltage line 124, fifth gate electrode 125e, and sixth gate electrode 125f. The second capacitor condenser plate 127 may include a same material, and may be formed on the same layer as gate line 121, prior gate line 122, first gate electrode 125a, second gate electrode 125b, third gate electrode 125c, and fourth gate electrode 125d. The first capacitor condenser plate 126 and second capacitor condenser plate 127 may be formed of a gate wire including at least one of aluminum (Al), chromium (Cr), molybdenum (Mo), titanium (Ti), tantalum (Ta), an Al—Ni—La alloy, or an Al—Nd alloy. With this structure, storage capacitance may be improved compared to a structure in which only one of the condenser plates of the storage capacitor 80 is formed of the semiconductor.

In one embodiment, the second capacitor condenser plate of the storage capacitor may be formed on the same layer as the data line 171 and the driving voltage line 172, and on the same layer as the gate line 121 and the prior gate line 122.

The driving voltage line 172 overlaps the storage capacitor 80 and extends to intersect the initialization voltage line 124, prior gate line 122, and fourth transistor T4. One portion of driving voltage line 172 corresponds to the fifth source electrode 176e and is connected to the source region of the fifth semiconductor through contact hole 71. Another portion of driving voltage line 172 is connected to the second capacitor condenser plate 127 through a contact hole 66 in the interlayer insulating layer.

The connecting member 74 may be formed in the same layer and in parallel with driving voltage line 172. One end of connecting member 74 is connected to the first gate electrode 125a through a contact hole 67 in the interlayer insulating layer. Another end of connecting member 74 is connected to fourth drain electrode 177d. A portion of connecting member 74 is connected to the first capacitor condenser plate 126 and the drain region of the third semiconductor 131c through a contact hole 68 exposing the third drain electrode 177c and the first capacitor condenser plate 126.

Accordingly, a capacitance corresponding to the difference between the driving voltage ELVDD transferred through the driving voltage line 172 and the gate voltage of the first gate electrode 125a is stored in the storage capacitor 80.

The second transistor T2 is used as a switching element for selecting the pixel to emit light. The second gate electrode 125b is connected to the gate line 121, and the second source electrode 176b is connected to the data line 171 through a contact hole 69 in the first gate insulating layer, the second gate insulating layer, and the interlayer insulating layer. The second drain electrode 177b is connected to the first transistor T1 and fifth transistor T5. In addition, the sixth drain electrode 177f of the sixth transistor T6 is directly connected to a first electrode 710 of OLED 70 through a contact hole 181 in the protective layer.

FIGS. 3 and 4 illustrate a structure of the pixel in cross-section. In these figures, the first transistor T1, second transistor T2, and sixth transistor T6 are mainly illustrated. The stacking structures of the third transistor T3 and fourth transistor T4 may be similar to the stacking structures of the first transistor T1 and second transistor T2. Also, the stacking structure of the fifth transistor T5 may be similar to the stacking structure of the sixth transistor T6.

Referring to FIG. 3 and FIG. 4, a buffer layer 120 is formed on a substrate 110. The substrate 110 may be, for example, a transparent insulative substrate made of glass, quartz, a polymer material, or the like. Alternatively, the substrate 110 may be a metallic substrate made of, for example, stainless steel. The polymer material may be an organic material selected from a group consisting of polyethersulfone (PES), polyacrylate (PAR), polyetherimide (PEI), polyethylene naphthalate (PEN), polyethylene terephthalate (PET), polyphenylene sulfide (PPS), polyallylate, polyimide, polycarbonate (PC), cellulose triacetate (TAC), and cellulose acetate propionate (CAP), which are insulative organic materials.

The buffer layer 120 may be a single-layer structure of a silicon nitride (SiNx), or a double-layer structure including stacked silicon nitride (SiNx) and silicon oxide (SiO$_x$). The buffer layer 120 serves to flatten the surface while simultaneously preventing unnecessary components (such as impurities or water) from infiltrating.

The first semiconductor 131a, second semiconductor 131b, and sixth semiconductor 131f may be made of polysilicon and may be formed on buffer layer 120. The first semiconductor 131a may include the source region and drain region disposed at respective sides of a channel region 131a1. The source region and drain region may serve as the first source electrode 176a and second drain electrode 177b, respectively.

The second semiconductor 131b includes source and drain regions disposed at respective sides of a channel region 131b1. The drain region may serve as the second drain electrode 177b and a source region 131b2 is connected to the second source electrode 176b. The sixth semiconductor 131f includes source and drain regions disposed at respective sides of a channel region 131f1. The source region may serve as the sixth source electrode 176f, and a drain region 131f2 is connected to the sixth drain electrode 177f.

A first gate insulating layer 141, which may be made of silicon nitride (SiNx) or silicon oxide (SiO$_x$), may be formed on the first semiconductor 131a, second semiconductor 131b, and sixth semiconductor 131f.

The light emission control line 123 including the fifth gate electrode 125e and sixth gate electrode 125f, and a first gate wire (123, 125e, 125f, 124, and 126) including the initialization voltage line 124 and first capacitor condenser plate 126, are formed on the first gate insulating layer 141.

A second gate insulating layer 142 is formed on the first gate wire (123, 125e, 125f, 124, and 126) and the first gate insulating layer 141. The second gate insulating layer 142 is made of, for example, silicon nitride (SiNx) or the silicon oxide (SiO$_x$).

The gate line 121 including the first gate electrode 125a, second gate electrode 125b, and third gate electrode 125c, and a second gate wire (125a, 125b, 125c, 121, 122, and 127) including the prior gate line 122 and second capacitor condenser plate 127, are formed on the second gate insulating layer 142.

As described above, because the first gate insulating layer 141 and second gate insulating layer 142 are formed between the first semiconductor 131a and first gate electrode 125a, an interval (or spacing) between the first semiconductor 131a and first gate electrode 125a is widened. Therefore, a driving range of the gate voltage applied to the first gate electrode 125a is increased to allow all gray scale values to be expressed.

The interlayer insulating layer 160 is formed on the second gate wire (125a, 125b, 125c, 121, 122, and 127) and second gate insulating layer 142. The interlayer insulating layer 160 may be made of, for example, a ceramic-based material such as silicon nitride (SiNx) or the silicon oxide (SiO$_x$), similar to the first gate insulating layer 141 and second gate insulating layer 142.

The data line 171, fourth drain electrode 177d, and third drain electrode 177c including the second source electrode 176b, connecting member 74 connected to the fourth drain electrode 177d and third drain electrode 177c, and the data wire including the driving voltage line 172 including the sixth drain electrode 177f and fifth source electrode 176e are formed on the interlayer insulating layer 160.

The second source electrode 176b and sixth drain electrode 177f are connected to source region 131b2 of second semiconductor 131b through the contact holes 69 and 72 in the first gate insulating layer 141, second gate insulating layer 142, and interlayer insulating layer 160. In addition, connecting member 74 and driving voltage line 172 are connected to the first gate electrode 125a and the second capacitor condenser plate 127 through respective contact holes 67 and 66 in the interlayer insulating layer 160.

The protective layer 180 covering the data wire (171, 172, 174, and 177f) is formed on the interlayer insulating layer 160. The first electrode 710 is formed on the protective layer 180. The first electrode 710 is connected to the sixth drain electrode 177f through the contact hole 181 formed in the protective layer 180.

A pixel definition layer 190 having an opening 95 exposing the first electrode 710 is formed on the protective layer 180 and first electrode 710. The pixel definition layer 190 may be made of a resin (e.g., polyacrylate resin, polyimide resin, etc.) or silica-based inorganic material.

Organic emission layer 720 is formed on first electrode 710 in opening 95. A second electrode 730 is formed on organic emission layer 720. As described above, the first electrode 710, organic emission layer 720, and second electrode 730 may be used to configure OLED 70.

In one embodiment, the first electrode 710 is an anode, which is a hole injection electrode. The second electrode 730 is a cathode, which is electron injection electrode. Alternatively, the first electrode 710 may be a cathode and the second electrode 730 may be an anode. Holes and electrons are respectively injected into the organic emission layer 720 from the first electrode 710 and second electrode 730, and light is emitted when the excitons (which are combinations of the holes and electrons) transition from an excited state to a ground state.

The organic emission layer 720 may be made of a small molecule organic material or polymer organic material, for example, such as poly(3,4-ethylenedioxythiophene) (PEDOT). In addition, the organic emission layer 720 may be formed of a multilayer including at least one of among additional layers such as a hole injection layer (HIL), a hole transport layer (HTL), an electron transport layer (ETL), or an electron injection layer (EIL) together with the emission layer. When the organic emission layer 720 includes multiple layers, the hole injection layer (HIL) may be disposed on the first electrode 710 which is cathode, and then the hole transport layer (HTL), emission layer, electron transport layer (ETL), electron injection layer (EIL) may be sequentially stacked on the hole injection layer.

The organic emission layer 720 may include a red organic emission layer emitting red light, a green organic emission layer emitting green light, or a blue organic emission layer emitting blue light. The red organic emission layer, green organic emission layer, and blue organic emission layer are respectively formed in a red pixel, a green pixel, and a blue pixel to display a color image.

In addition, the organic emission layer 720 may stack all of the red organic emission layer, green organic emission layer, and blue organic emission layer in the red pixel, green pixel, and blue pixels. A red color filter, green color filter, and blue color filter may be provided for each pixel, to thereby implement a color image.

As another example, the organic emission layer 720 may stack a white organic emission layer emitting white light in all of the red pixel, green pixel, and blue pixels. The red color filter, green color filter, and blue color filter may be provided for each pixel, to thereby implement a color image.

When implementing color images using the white organic light emission layer and color filters, a deposition mask for depositing the red organic emission layer, green organic emission layer, and blue organic emission layer in each of the separate pixels (that is, the red pixel, green pixel, and blue pixel) does not have to be used.

The white organic emission layer may be formed of a single organic emission layer, and may include a configuration emitting white light by stacking a plurality of organic emission layers. For example, the white organic emission layer may include configurations emitting white light by combining at least one yellow organic emission layer and at least one blue organic emission layer, combining at least one cyan organic emission layer and at least one red organic emission layer, and/or combining at least one magenta organic emission layer and at least one green organic emission layer.

The second electrode 730 may be formed of a reflective conductive material, to thereby implement a back emissive-type OLED display. The reflective conductive material may include one or more of lithium (Li), calcium (Ca), lithium fluoride/calcium (LiF/Ca), lithium fluoride/aluminum (LiF/Al), aluminum (Al), silver (Ag), magnesium (Mg), or gold (Au).

A capping layer 260 may be disposed on the second electrode 730 to protect the OLED 70. The capping layer 260 may be formed of a multi-layer including materials having a different refractive index, so that light generated from organic emission layer 720 may be efficiently emitted. The capping layer may be made of at least one organic material or inorganic material selected among $SiO_x$, SiNx, SiON, $ZnO_2$, $TiO_2$, $ZrO_2$, $Alq_3$, CuPc, CBP, a-NPB, ITO, IZO, and $ZiO_2$.

A spacer 310 may be formed on the capping layer 260. The spacer 310 prevents the OLED display from being damaged due to external impact, pressure, or the like. The spacer 310 may form a specific space between an encapsulation substrate 210 and substrate 110. Therefore, an external impact may be absorbed and, thus, spacer 310 may prevents the OLED display from being damaged.

In one embodiment, spacer 310 is disposed within a boundary line of opening 95 and in overlapping relation with storage capacitor 80. The spacer 310 may be made of the same material as the pixel definition layer 190, and may be formed, for example, within a thickness range of 2000 Å to 5000 Å greater than that of the pixel definition layer 190. When a height of the pixel definition layer exceeds 5000 Å, transferring may not be performed. This is because a degree of expansion of an interlayer of a donor film is lower than a step of the pixel definition layer at the time of the transfer process. When the height of the pixel definition layer is less than 2000 Å, it may be difficult to achieve uniformity because the height of the pixel definition layer is low.

When spacer 310 of the OLED display is within the opening, the step caused by the first electrode in which the organic emission layer is formed may be reduced more than the case of forming the spacer on the pixel definition layer.

The region at which storage capacitor 80 is disposed may protrude, compared to a region at which the metal layer is not disposed by the first capacitor condenser plate 126 and the second capacitor condenser plate 127 forming the storage capacitor 80.

The region at which the gate wire including the gate electrode (which is formed at the same layer as the first capacitor condenser plate 126 and the second capacitor condenser plate 127 is disposed) may also protrude. However, the region may not be large enough to form the spacer thereon in some cases. Therefore, the spacer may be formed to overlap the storage capacitor.

The encapsulation substrate 210 is disposed on spacer 310. The encapsulation substrate 210 (which is, for example, a transparent insulative substrate made of glass, quartz, ceramic, or a polymer material) may be made of the same material as substrate 110. The encapsulation substrate 210 is sealed by bonding it with the substrate 110 to protect the OLED 70. The encapsulation substrate 210 and substrate 110 may be sealed by a sealing material.

An air gap 300 may be formed in a space between the encapsulation substrate 210 and capping layer 260. In addition, the empty space between the encapsulation substrate 210 and capping layer 260 may be filled with organic material, to thereby improve the strength and durability of the OLED.

Figure 5:
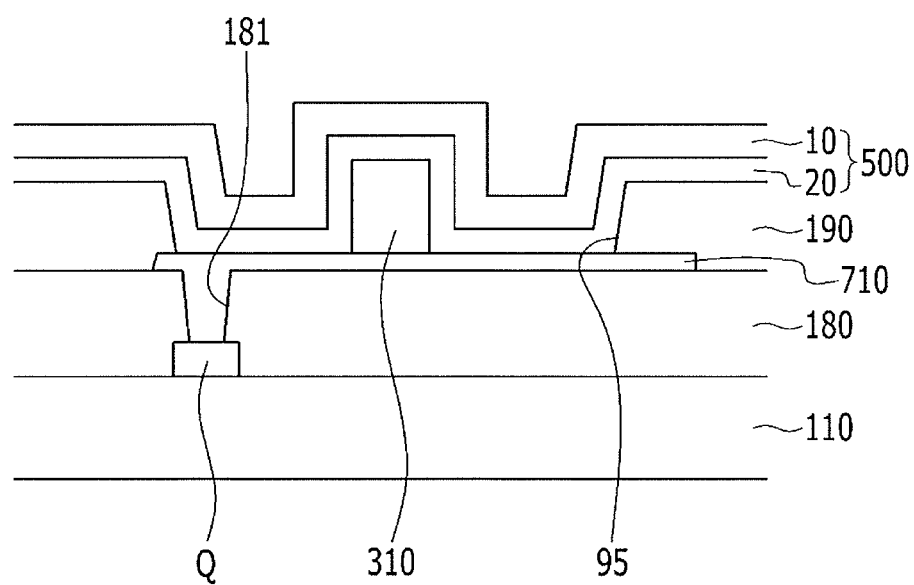
FIGS. 5 and 6 illustrate transfer of an organic emission layer using a donor film according to one embodiment of a method of manufacturing an OLED display.
Figure 6:
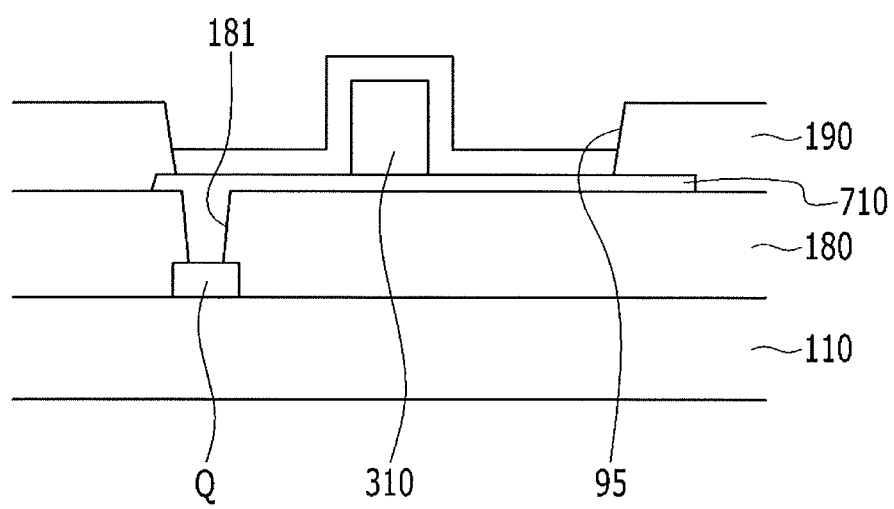

FIGS. 5 and 6 illustrate cross-sectional views describing transfer of an organic emission layer using a donor film according to one embodiment of a manufacturing method of an OLED display. As shown in FIG. 5, a transistor Q is formed on the insulation substrate 110. A protective layer 180 having a plurality of contact holes 181 is formed on the transistor Q. The transistor Q may be, for example, the sixth transistor in FIG. 2. In at least one embodiment, the first transistor and first electrode may be connected to each other without the sixth transistor.

Further, the first electrode 710 is formed on the protective layer 180. Next, the pixel definition layer 190 and spacer 310 are formed on first electrode 710. In this case, the pixel definition layer 190 and spacer 310 may be formed of the same material.

According to one embodiment, when spacer 310 is formed to overlap the storage capacitor, even when spacer 310 has a same thickness as pixel definition layer 190, spacer 310 protrudes more than the pixel definition layer by a thickness of the storage capacitor. Therefore, a separate process in which pixel definition layer 190 and spacer 310 are formed to have different thicknesses may be omitted.

Then, a donor film 500 is disposed on opening 95 of the substrate 100 on which the first electrode 710 is formed. The donor film 500 has a structure in which a base film 10 and a transfer layer 20 are stacked. The base film 10 may be made of a transparent material, for example, at least one polymer material selected from a group consisting of polyester, polyacryl, polyepoxy, polyethylene, polystyrene, and polyethylene terephthalate, or glass, in order to transmit the light to a heat converting layer.

The heat converting layer may not be formed between the base film 10 and transfer layer 20. In addition, the heat converting layer (which is a layer that converts a portion or more of infrared rays and visible rays into heat) has an appropriate optical density and may include a light absorbing material for absorbing light. The heat converting layer may be made, for example, of a metal layer including Al, Ag, and oxides and sulfides thereof, or an organic layer made of a polymer including carbon black, graphite, or an infrared dye.

As shown in FIG. 6, the base film 10 and transfer layer 20 are separated by irradiating a laser to donor film 500. Then, the organic emission layer is formed on the first electrode 710 by removing the donor film. According to this embodiment, the formation of a step is reduced or minimized by reducing the thickness of the spacer, thereby making it possible to reduce or minimize the non-transfer region at the time of a laser-induced thermal imaging (LITI) process.

Figure 7:
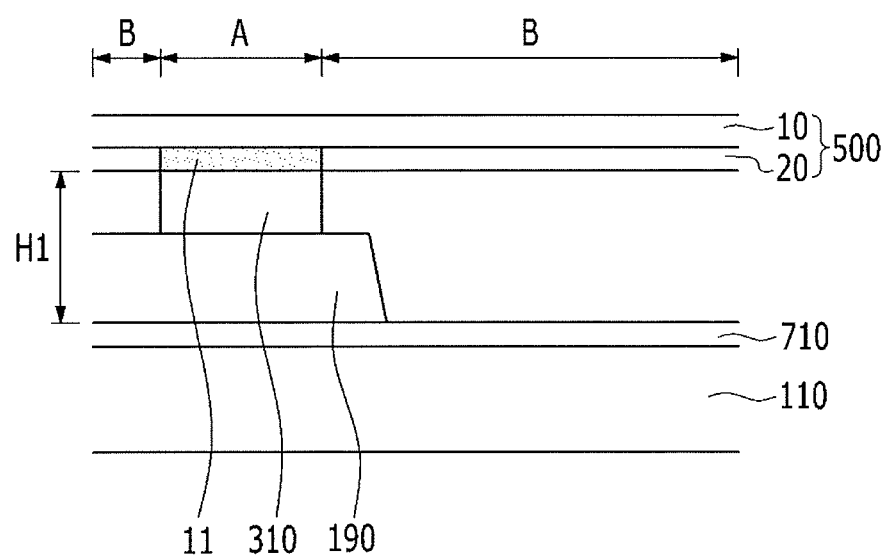
FIGS. 7 and 8 illustrate an OLED display produced by an LITI method.
Figure 8:
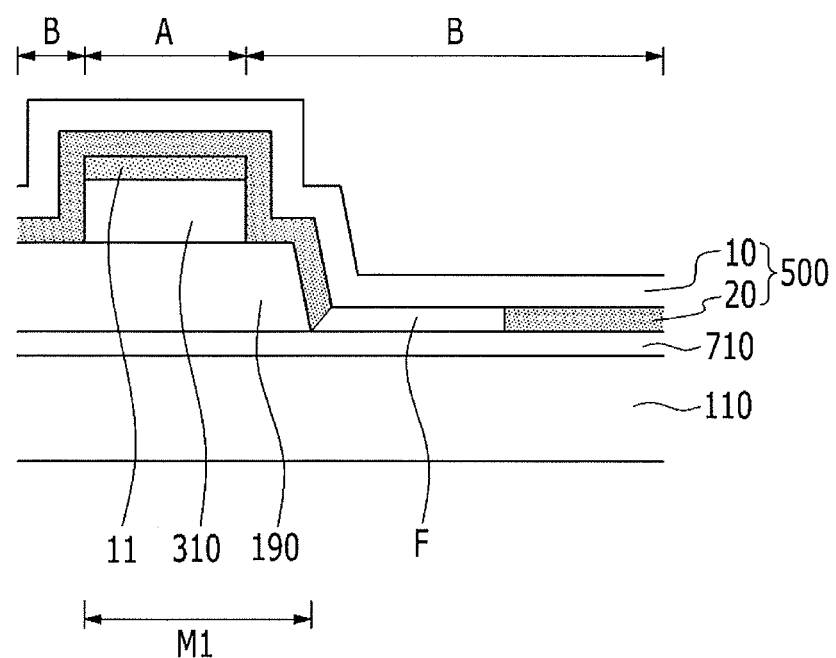
Figure 9:
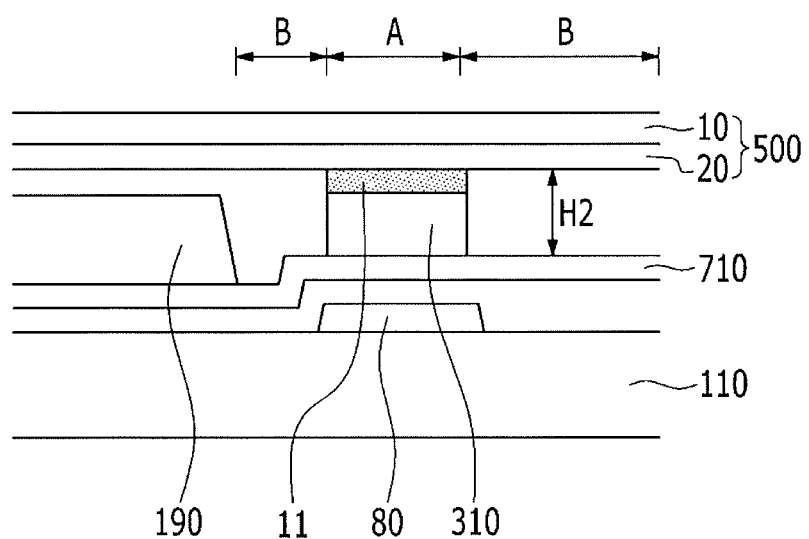
FIGS. 9 and 10 illustrate cross-sectional views of an OLED display corresponding to an embodiment of a laser-induced thermal imaging method.
Figure 10:
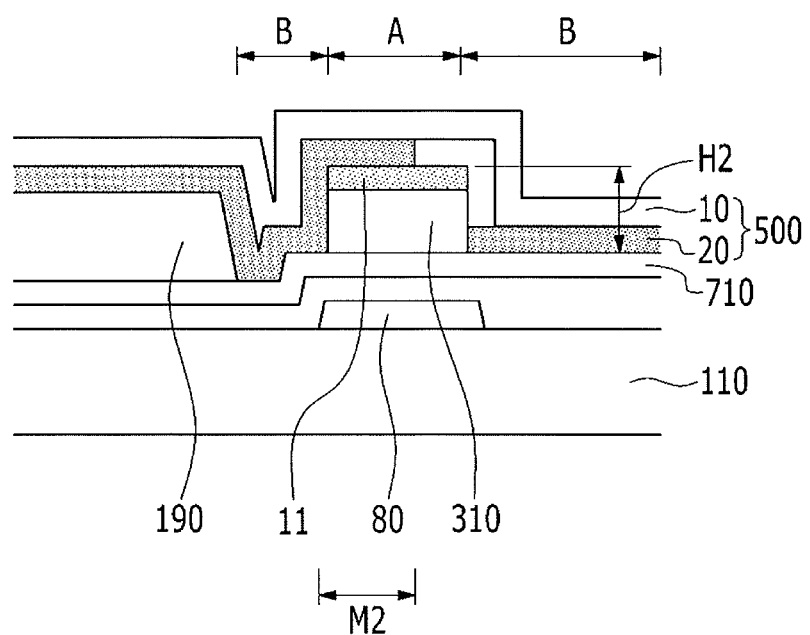

FIGS. 7 and 8 illustrate schematic cross-sectional views of an OLED display for describing one type of laser-induced thermal imaging (LITI) process. FIG. 9 and FIG. 10 illustrate schematic cross-sectional views of an OLED display for describing one embodiment of a laser-induced thermal imaging (LITI) process.

As shown in FIG. 6, in order to form the organic emission layer on the substrate, first, donor film 500 is disposed on the substrate as shown in FIGS. 7 and 9. The donor film 500 is not completely close to the substrate 110. Also, the donor film 500 and spacer 310, which relatively protrude from substrate 110, are connected to each other in a temporarily alignment state.

Hereinafter, as shown in FIG. 8 and FIG. 10, the donor film 50 is very close to substrate 110 by vacuum bonding. Also, the organic emission layer is formed within the opening by irradiating the laser. In this case, while closely bonded to the substrate, the donor film 500 of a different position from the temporarily alignment state (for example, the donor film of a region A corresponding to the spacer 310) may move to a light emitting region B while being closely bonded to the substrate.

The transfer layer of the donor film disposed at region A corresponding to the spacer is connected to spacer 310, and is transferred on spacer 310 to form a first transfer layer 11. When the donor film moves, the removed region F1 is disposed at light emitting region B by forming the first transfer layer 11.

Meanwhile, at the time of vacuum bonding, the donor film may vary according to the step between the first electrode 710 and spacer 310. In this case, although spacer 310 is spaced from opening 95 by disposing it on the pixel definition layer 190, the step H1 between the first electrode 710 and spacer 310 is large. Also, a variation M1 of the donor film is large as shown in FIG. 7.

Referring to FIG. 9, when spacer 310 is formed within opening 95, step H1 between the spacer 310 and first electrode 710 is reduced, compared with the aforementioned case. As a result, variation M2 of the donor film may be reduced.

Accordingly, a region F which is the transfer layer, that is removed in 95 in FIG. 6, is the light emitting region of the non-transfer region. However, in the present embodiment, spacer 310 is formed to thereby allow for a reduction of the non-transfer region within opening 95.

Referring again to FIG. 4, the second electrode 730 is sequentially stacked on organic emission layer 720, the capping layer is formed thereon, and then the OLED is completed by sealing the encapsulation substrate.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise indicated. Accordingly, it will be understood by those of skill in the art that various changes in form and details may be made without departing from the spirit and scope of the present invention as set forth in the following claims.

What is claimed is:

1. An organic light emitting diode (OLED) display, comprising:
   a substrate;
   a first transistor on the substrate;
   a first electrode connected to the first transistor;
   a pixel definition layer on the first electrode and having an opening exposing the first electrode;
   a spacer at the opening;
   a storage capacitor on the substrate and overlapping the opening;
   an organic emission layer on the exposed first electrode; and a second electrode on the organic emission layer,
   wherein opposing sidewalls of the opening surround the spacer.

2. The display as claimed in claim 1, wherein the spacer extends above the pixel definition layer by a distance which includes at least a thickness of the storage capacitor.

3. The display as claimed in claim 1, wherein the spacer overlaps the storage capacitor.

4. The display as claimed in claim 3, wherein the spacer is within a boundary line of the storage capacitor.

5. The display as claimed in claim 1, wherein the spacer includes a same material as the pixel definition layer.

6. The display as claimed in claim 1, further comprising:
   an encapsulation substrate facing the substrate and encapsulating the organic emission layer.

7. The display as claimed in claim 1, further comprising:
   a scan signal line on the substrate;
   a data line insulated from and intersecting the scan signal line; and
   a second transistor connected to the scan signal line, the data line, and the first transistor.

8. The display as claimed in claim 7, wherein:
   a source electrode of the first transistor is connected to a driving voltage line, and
   a gate electrode of the first transistor is connected to a drain electrode of a second thin film transistor.

9. The display as claimed in claim 8, further comprising:
   a third transistor on the substrate,
   wherein a drain electrode of the first transistor is connected to a source electrode of the third transistor, and the first electrode is connected to the drain electrode.

10. The display as claimed in claim 9, wherein
    the third transistor includes a first gate insulating layer between a semiconductor and a gate electrode of the third transistor, and
    the first transistor includes a first gate insulating layer between a semiconductor and a gate electrode of the first transistor and a second gate insulating layer on the first gate insulating layer.

11. The display as claimed in claim 10, wherein the second gate insulating layer covers the gate electrode of the third transistor.

12. The display as claimed in claim 10, wherein the storage capacitor includes a first capacitor condenser plate on the first gate insulating layer and a second capacitor condenser plate on the second gate insulating layer and overlapping the first capacitor condenser plate.

13. The display as claimed in claim 12, wherein:
    the first capacitor condenser plate includes a same material as the gate electrode of the third transistor, and
    the second capacitor condenser plate includes a same material as the gate electrode of the first transistor.

14. The display as claimed in claim 1, wherein the spacer includes:
    a first region; and
    a second region spaced from the first region,
    wherein the first and second regions have different widths.

15. A pixel, comprising:
    a pixel definition layer having an opening;
    an organic light emitting device at least partially in the opening;
    a storage capacitor overlapping the opening; and
    a spacer in the opening adjacent the organic light emitting device,
    wherein an upper surface of the spacer is above an upper surface of the organic light emitting device,
    wherein opposing sidewalls of the opening surround the spacer.

16. The pixel as claimed in claim 15, wherein the spacer extends above the pixel definition layer by a distance which includes at least a thickness of the storage capacitor.

17. The pixel as claimed in claim 15, wherein the organic light emitting device overlaps the storage capacitor.

18. The pixel as claimed in claim 15, wherein the organic light emitting device includes an organic emission layer between first and second electrodes.

19. The pixel as claimed in claim 15, wherein:
the pixel definition layer and spacer have substantially a same thickness, and
the upper surface of the spacer is above an upper surface of the pixel definition layer.

20. The pixel as claimed in claim 15, wherein the spacer is spaced from the pixel definition layer.

* * * * *